United States Patent
Jaiprakash et al.

(10) Patent No.: US 6,621,112 B2
(45) Date of Patent: Sep. 16, 2003

(54) DRAM WITH VERTICAL TRANSISTOR AND TRENCH CAPACITOR MEMORY CELLS AND METHODS OF FABRICATION

(75) Inventors: Venkatachalam C. Jaiprakash, Beacon, NY (US); Mihel Seitz, Wappingers Falls, NY (US); Norbert Arnold, Chestnut Ridge, NY (US)

(73) Assignee: Infineon Technologies AG, Munich (DE)

( * ) Notice: Subject to any disclaimer, the term of this patent is extended or adjusted under 35 U.S.C. 154(b) by 5 days.

(21) Appl. No.: 09/731,343

(22) Filed: Dec. 6, 2000

(65) Prior Publication Data

US 2002/0066917 A1 Jun. 6, 2002

(51) Int. Cl.[7] .......................... H01L 27/108; H01L 29/76
(52) U.S. Cl. ......................................... 257/301; 257/302
(58) Field of Search .................................. 257/301, 302

(56) References Cited

U.S. PATENT DOCUMENTS

| | | | | |
|---|---|---|---|---|
| 5,225,697 A | * | 7/1993 | Malhi et al. | 257/302 |
| 6,153,902 A | * | 11/2000 | Furukawa et al. | 257/301 |
| 6,204,140 B1 | * | 3/2001 | Gruening et al. | 438/386 |
| 6,281,539 B1 | * | 8/2001 | Mandelman et al. | 257/302 |
| 6,284,593 B1 | | 9/2001 | Mandelman et al. | |
| 6,333,533 B1 | * | 12/2001 | Furukawa et al. | 257/301 |

OTHER PUBLICATIONS

Article entitled A Novel Trench DRAM Cell With A VERtiCAL Access Transistor And BuriEd STrap (Veri Best) for 4Gb/16Gb.

* cited by examiner

*Primary Examiner*—Eddie Lee
*Assistant Examiner*—Joseph Nguyen
(74) *Attorney, Agent, or Firm*—Thomas R. FitzGerald, Esq.

(57) ABSTRACT

A semiconductor Dynamic Random Access Memory (DRAM) cell is fabricated using a vertical access transistor and a storage capacitor formed in a vertical trench. A Shallow Trench Isolation (STI) region is used as a masking region to confine the channel region of the access transistor, the first and second output regions of the access transistor, and a strap region connecting the second output region to the storage capacitor, to a narrow portion of the trench. The so confined second output region of the access transistor has reduced leakage to similar second output regions of adjacent memory cells. Adjacent memory cells can then be placed closer to one another without an increase in leakage and cross-talk between adjacent memory cells.

5 Claims, 19 Drawing Sheets

US 6,621,112 B2

DRAM WITH VERTICAL TRANSISTOR AND TRENCH CAPACITOR MEMORY CELLS AND METHODS OF FABRICATION

FIELD OF THE INVENTION

This invention relates to a method of fabricating a dynamic random access memory (DRAM), and more particularly, to a DRAM memory cell composed of a storage capacitor and a vertical channel Insulated Gate Field Effect Transistor (IGFET) both formed in a semiconductor body, and a method of fabricating a connection (strap) between the IGFET and a plate of the capacitor.

BACKGROUND OF THE INVENTION

There is a continuing trend towards increasing the capacity of DRAMS. Such an increase in capacity is best achieved by decreasing the surface area of the memory cells and increasing their packing density to increase the number of memory cells in the semiconductor body (silicon chip) that houses the DRAM. The reduction in surface area and increase in packing density can be achieved by both a decrease in the feature sizes of the elements of the DRAM, and by the use of transistors, capacitors, and interconnect structures which are three-dimensional in nature, with their active elements lying not only on the surface of the semiconductor body, but also extending down into the interior of the semiconductor body.

One technique which has been used to increase the packing density of the memory cells has been to use a vertical trench in which is formed a capacitor that serves as a storage element of the memory cell. A further technique has been to use as the access transistor a vertical channel transistor formed on the sidewall of the vertical trench in which the capacitor is formed.

FIG. 1 shows the elements of a well known prior art DRAM memory cell comprising a field effect transistor 130 and a capacitor 140. Transistor 130 has a first output 133 connected to a first plate 141 of the capacitor 140 whose second plate is connected to a common potential, typically ground potential. A connection between the output 133 and the capacitor plate 141 is made by means of an interconnection structure 150. A second output 131 of the transistor 130 is connected to a bit line 110, and a gate (control electrode) 132 of the transistor 130 is connected to a word line 120. Multiple bit lines, of which bit line 110 is one, run vertically through an array of the memory cells, and multiple word lines, of which word line 120 is one, run horizontally through the array of memory cells.

Traditionally, the transistors 130 and capacitors 140 were formed as planar devices on the surface of a semiconductor body.

FIG. 2 shows schematically the cross-section of a prior art implementation of a transistor-capacitor DRAM memory cell in which a storage capacitor 240 is formed in a lower portion of a vertical trench 260 in a semiconductor 200, and a transistor 230, which comprises a first output region 231, a second output region 233, and a gate 232, has a channel region 235 formed on a sidewall 236 in an upper portion of the vertical trench 260. In a typical embodiment semiconductor body 200 is of p-type conductivity. A relatively thick silicon dioxide insulting layer 261 is formed on a major portion 265 of a surface of the trench 260. At a bottom of the trench 260 the thick oxide layer 261 is replaced with a thinner oxide layer 243. On sidewall 236 of the surface of an upper portion of the trench 260 a thin gate oxide layer 234 is formed, and serves as the gate oxide of the transistor 230. A portion 263 of the oxide layer 261 has been removed. A lower portion of the trench 260 has been filled up to a level above the thinner oxide layer 243, and above the opening 263, with a conducting material, typically highly-doped polysilicon of n-type conductivity, which forms the first plate 241 of the capacitor 240. The second plate 242 of the capacitor 240 is formed by the semiconductor body 200. A top surface 244 of capacitor plate 241 is covered with a thick oxide layer 262. N-type dopant material diffuses from the capacitor plate 241 through the opening 263 into the semiconductor body 200 to form an n-type semiconductor region 233 which serves as the second output region 233 of the transistor 230. The portion of the trench 260 above the oxide layer 262 is filled with a conducting material, typically n-type polysilicon, to form a gate electrode 232 of the transistor 230. The first output region 231 is formed on a top surface 202 of the semiconductor body 200 and in one embodiment is of n-type conductivity. A word line 220 is formed on the surface 223 of the insulator layer 222 and contacts gate electrode 232 through an opening 221 in layer 222. A bit line 210 is formed on the surface 213 of the insulator layer 212 and contacts the second output region 231 through an opening 211 in layers 222 and 212.

The structure depicted in FIG. 2 implements the memory cell depicted in FIG. 1 in a three-dimensional structure with a conservative use of surface area of the semiconductor body 200.

FIG. 3 shows a sectional view, through the plane 3—3 of FIG. 2, of an array of prior art memory cells. A portion of each of four trenches, 260-1, 260-2, 260-3, and 260-4 of an array of such trenches are shown. A portion of the surface of each trench is covered with the thick oxide layers 261-1, 2, 3, and 4. The trenches have been filled with conductors 241-1, 2, 3, and 4. During processing a portion of the n-type dopant of the conductors 241-1, 2, 3, and 4 diffuses through the opening 263-1, 2, 3, and 4 (not shown) and forms the output regions 233-1, 2, 3, and 4 of the transistors.

It can be seen from the drawing that output regions 233-1, 233-2, 233-3, and 233-4 extend beyond the perimeter of the trenches themselves, and, in the case of output regions 233-1 and 233-3, are considerably closer to each other than are the trenches 260-1 and 260-3 themselves. The limiting factor in determining how close to each other the trenches can be placed is a minimum allowable distance between the output regions 233-1, 2, 3, and 4, rather than the minimum feature size of the lithographic and etching technologies. The minimum allowable distance between the output regions 233-1, 2, 3, and 4 is determined by considerations of leakage and performance of the memory cells. The distance between the output regions 233-1, 2, 3, and 4 is further influenced by variations in the out-diffusion of the dopant material and the voltage of the output region with respect to the semiconductor body. If two output regions become close enough, leakage current can flow between the two output regions. This can lead to failure of the memory array.

It is desirable to have a DRAM comprising an array of memory cells each having a vertical IGFET and a capacitor formed in a trench which has greater packing density than conventional DRAMs with high yields.

SUMMARY OF THE INVENTION

The present invention is directed to a novel dynamic random access memory (DRAM) comprising an array of memory cells each comprising a vertical insulated gate field effect transistor (IGFET) having a channel region and first and second output regions, and a capacitor formed in a trench with a strap region connecting a first plate of the capacitor to the second output region, and to a method of forming same. The design and method of fabrication of the novel DRAM memory cell results in a greatly increased distance between the output regions of the transistors of adjacent memory cells. This reduces the potential for leakage between adjacent memory cells which allows adjacent cells to be placed closer to one another and thereby increases packing density.

The method of the present invention uses two masking levels to limit an opening in a thick oxide layer covering a surface of a trench to a small portion of one side of the trench. The second output region of the transistor is formed by out-diffusion of impurities from the strap region and a doped polysilicon first plate of the capacitor through this opening. One of the two masks limits the size of the opening, and the other limits the opening to one side of the trench. The first of these two masks is a mask which in a conventional process defines the location of a shallow trench isolation region (STI) which subsequently defines the lateral location of the first output region of the transistor. The second mask restrains the location of the transistor and strap region of each memory cell to a single side of the memory cell structure.

A common mask is used to define the lateral position of the first output region and the lateral positions of the channel, second output, and the strap regions. Thus the output regions, channel region, and strap region of each memory cell are laterally self-aligned with respect to each other.

From a first apparatus aspect, the present invention is directed to an array of memory cells. Each memory cell is formed in and on a semiconductor body having a top surface and comprising a vertical field effect transistor having a gate and first and second output regions separated by a channel region and a capacitor formed within a trench in the semiconductor body. A first plate of the capacitor is partially surrounded by an insulating layer and is coupled to the second output region through a strap region with the insulating layer surrounding the first plate on all sides except for a selected portion of just one side of the first plate such that the second output region, which is formed by out-diffusion of impurities from the strap region and the first plate, is limited in lateral extent so as to limit electrical leakage between second output regions of adjacent memory cells.

From a second apparatus aspect, the present invention is directed to an array of memory cells. Each memory cell is formed in and on a semiconductor body having a top surface, with the memory cell comprising a vertical field effect transistor having a gate and first and second output regions separated by a channel region and a capacitor formed within a trench in the semiconductor body. A first doped polysilicon plate of the capacitor is partially surrounded by an insulating layer and is coupled to the second output region through a doped polysilicon strap region with the insulating layer surrounding the first plate on all sides except for a selected portion of just one side of the first plate such that the second output region, which is formed by out-diffusion of impurities from the strap region and the first plate, is limited in lateral extent so as to limit electrical leakage between second output regions of adjacent memory cells and the first output region being self aligned to the channel region and to the second output region.

From a first method aspect, the present invention is directed to method of forming an array of memory cells with each memory cell fabricated in and on a semiconductor body having a top surface, each memory cell comprising a vertical field effect transistor having a gate and first and second output regions separated by a channel region and a capacitor formed within a trench in the semiconductor body with a doped polysilicon first plate of the capacitor being partially surrounded by an insulating layer and being coupled to the second output region, which is formed by out-diffusion from the strap region and the first plate, through a doped polysilicon strap region with the insulating layer surrounding the first plate on all sides except for a selected portion of just one side of the first plate such that the second output region is limited in lateral extent to limit electrical leakage between second output regions of adjacent memory cells and the first output region being self aligned to the channel region and the second output region, the second output region being formed by out-diffusion of impurities from the strap and first plate regions, starting at a point in which separated trenches have been formed in the semiconductor body and a relatively thin oxide layer has been formed at a bottom surface of each of the trenches and along lower portions of the sidewalls of the trenches which intersect the bottom surface of the trenches and a relatively thick layer of oxide has been formed on the remaining portions of the sidewalls, and the trenches are filled with a first doped polysilicon. The method comprises the step of using shallow trench isolation regions to define the lateral extent of each of the first output regions, and the lateral extent of each of the second output regions, the channel regions and the strap regions.

From a first method aspect, the present invention is directed to a method of forming an array of memory cells with each memory cell fabricated in and on a semiconductor body having a top surface. Each memory cell comprises a vertical field effect transistor having a gate and first and second output regions separated by a channel region and a capacitor formed within a trench in the semiconductor body with a doped polysilicon first plate of the capacitor being partially surrounded by an insulating layer and being coupled to the second output region, which is formed by out-diffusion from the strap region and the first plate, through a doped polysilicon strap region with the insulating layer surrounding the first plate on all sides except for a selected portion of just one side of the first plate such that the second output region is limited in lateral extent to limit electrical leakage between second output regions of adjacent memory cells and the first output region being self aligned to the channel region and the second output region, the second output region being formed by out-diffusion of impurities from the strap and first plate regions, starting at a point in which separated trenches have been formed in the semiconductor body and a relatively thin oxide layer has been formed at a bottom surface of each of the trenches and along lower portions of the sidewalls of the trenches which intersect the bottom surface of the trenches and a relatively thick layer of oxide has been formed on the remaining portions of the sidewalls, and the trenches are filled with a first doped polysilicon. The method comprising the steps of: etching the first doped polysilicon from an upper portion of each trench down to a level above the thin oxide covering the bottom portions of the sidewalls of the trenches; forming a layer of silicon nitride over the exposed portions of the relatively thick oxide layer and a top surface of the remaining portion of the doped polysilicon; filling portions of the trenches lined with the layer of silicon nitride with a second doped polysilicon; forming shallow trench isolation regions extending from a top surface of the semiconductor body into the semiconductor body to partially define locations therein in which the first output region and the channel region of the transistor and the strap region are to be formed; removing portions of the second doped polysilicon not covered by the shallow trench isolation regions down to the silicon nitride layer formed on the top surface of the previously remaining portion of the first doped polysilicon which forms the first plate of the capacitor to define two sides of the trench, one of which is to contain the strap region and the channel region and a portion of one side of the second output region; forming a mask to define which of the two sides of the trench previously defined will contain the strap region; removing portions of the silicon nitride layer not covered by the mask or by the remaining second doped polysilicon; removing an exposed portion of the relatively thick oxide layer which is on the sidewalls of the trenches down to and below a top surface of the remaining portion of the first doped polysilicon which forms the first plate of each of the capacitors; removing the mask; removing the silicon nitride layer from a sidewall of the trench and a top portion over the remaining portion of the first doped polysilicon which is to become the first capacitor plate so as to expose the thick oxide layer on a sidewall of the trench; and filling the region of the trench in which the strap region is to be formed with a third doped polysilicon to from the strap region.

The invention will be better understood from the following more detailed description in conjunction with the accompanying drawing and claims.

Figure 1:
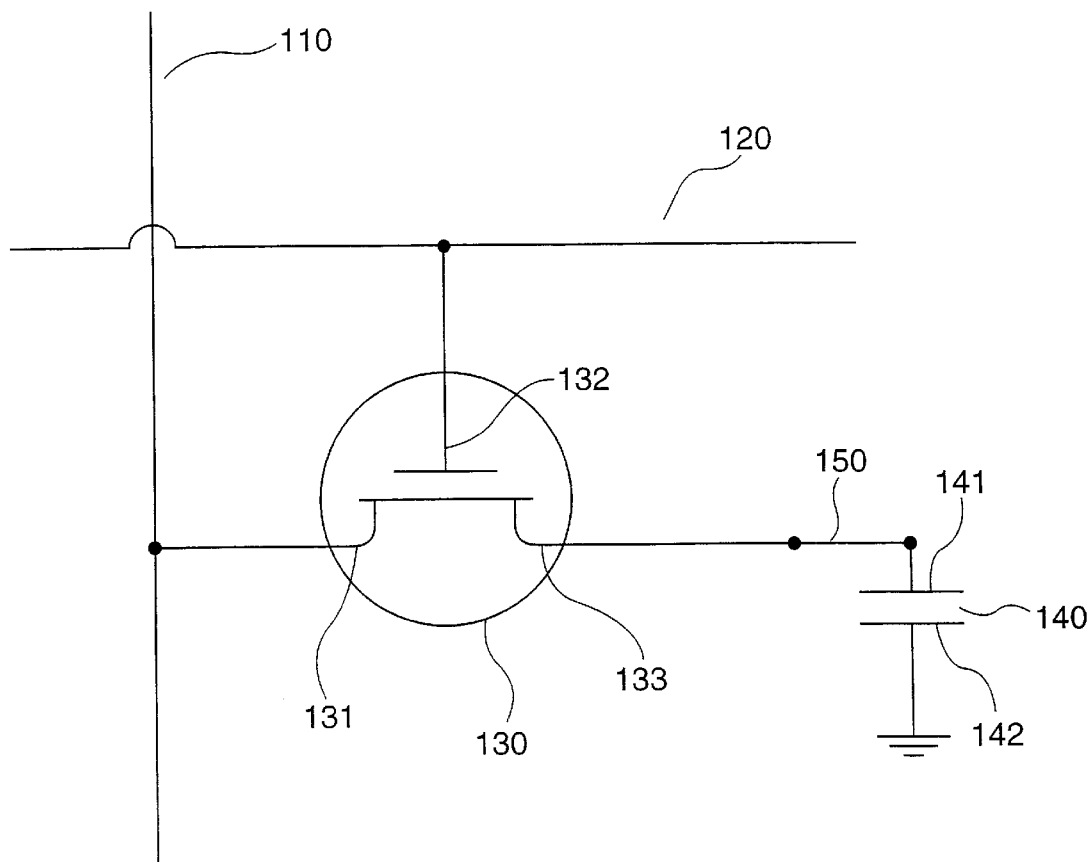
FIG. 1 shows an electrical schematic diagram of a prior art memory cell.
Figure 2:
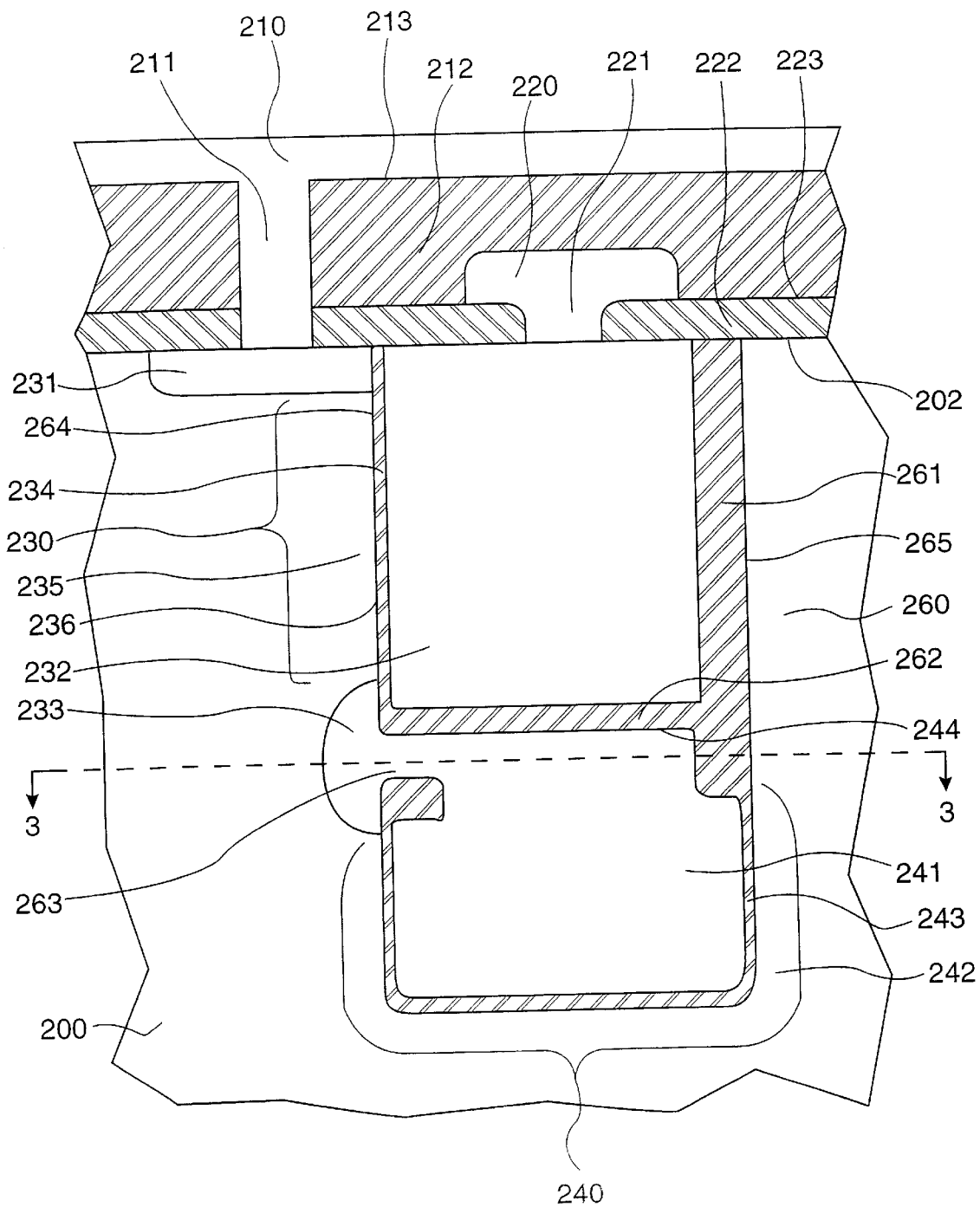
FIG. 2 shows a sectional view of a prior art memory cell.

The drawing may not necessarily be to scale.

DETAILED DESCRIPTION

Figure 4A:
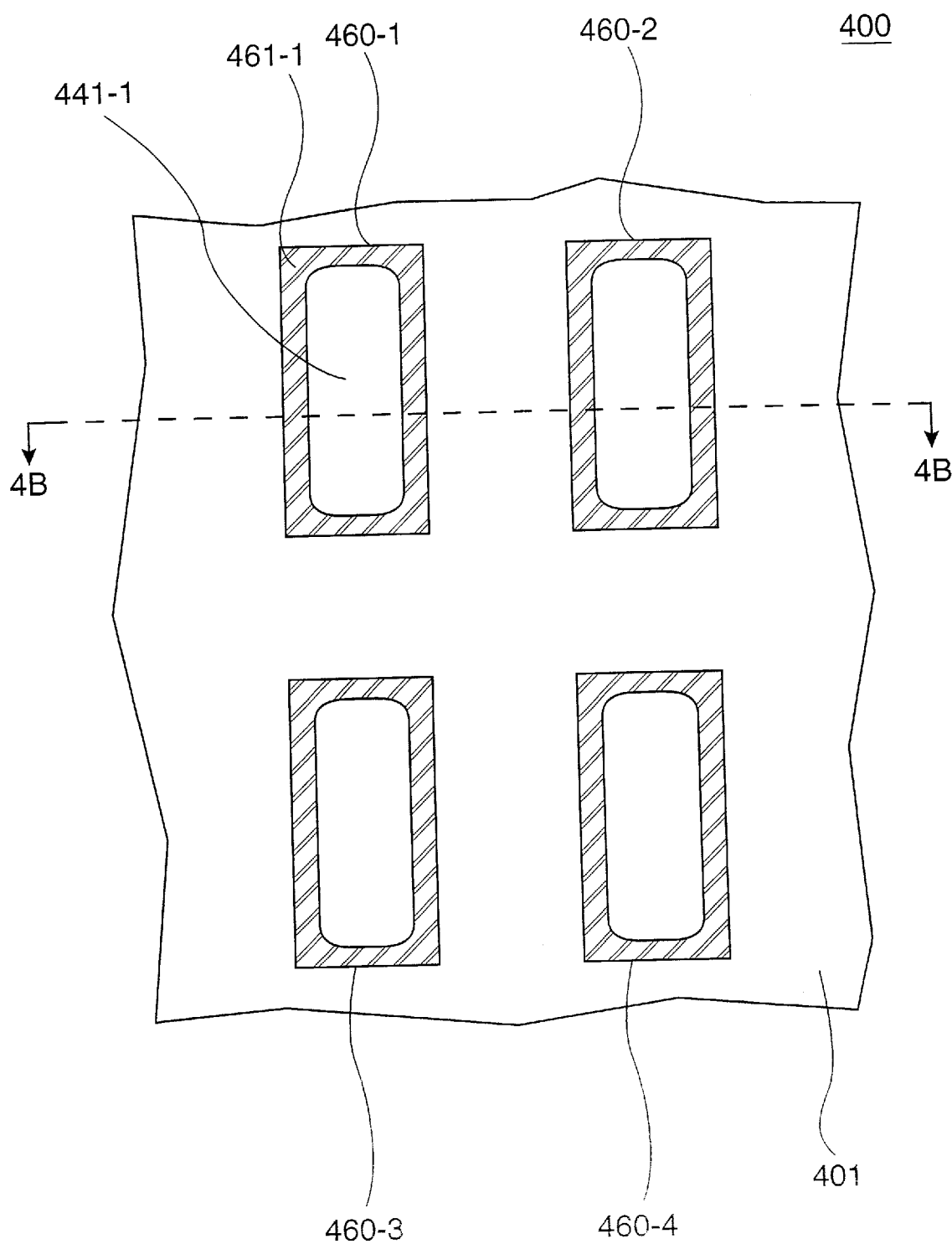
FIGS. 4A and 4B show a top view and a sectional view of a semiconductor body which has been prepared using prior art techniques up to the point where the method of the present invention will be applied to fabricate a memory cell.
Figure 4B:
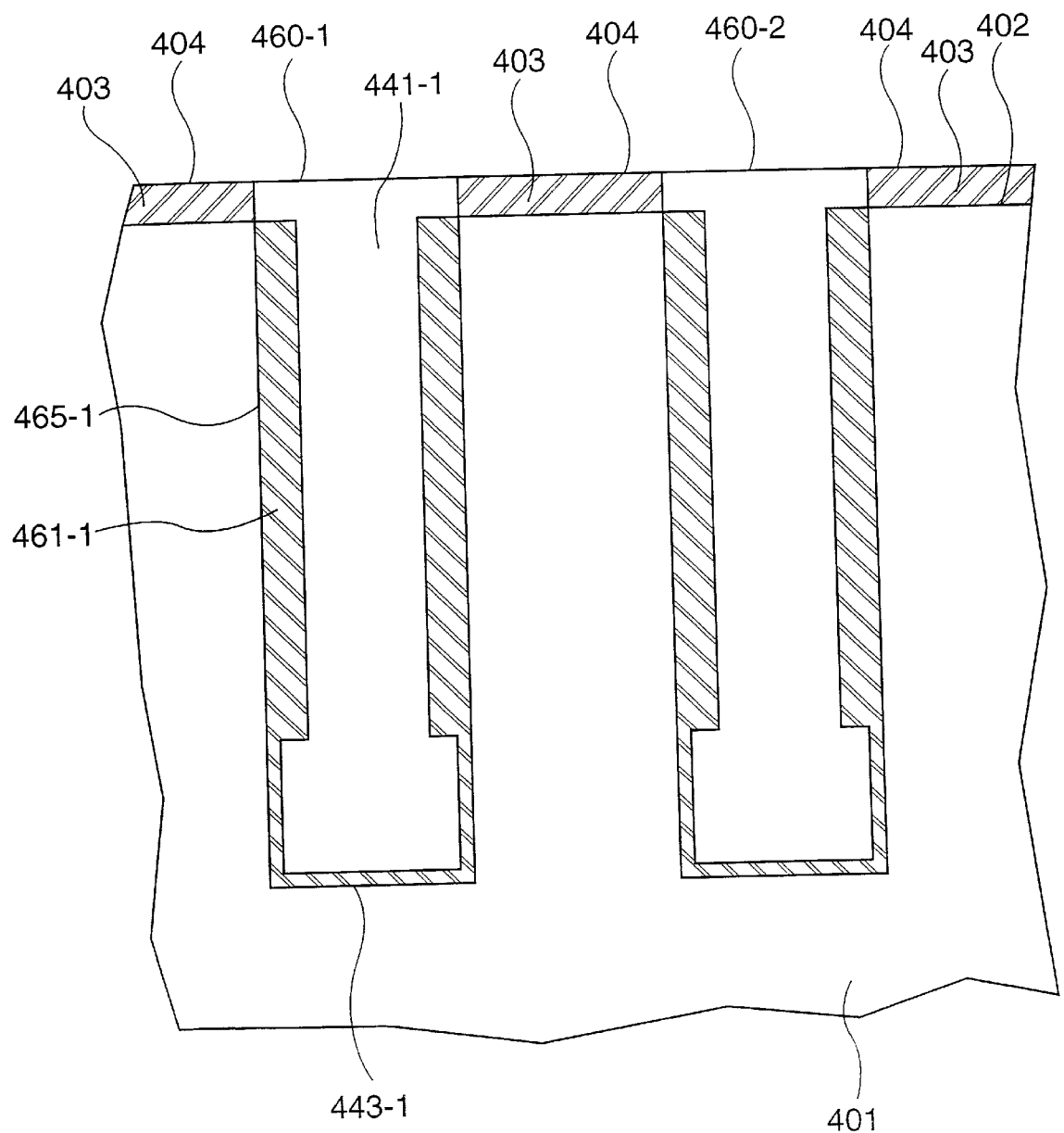

Referring now to FIGS. 4A and 4B, there are shown a top view (FIG. 4A) and a sectional view (FIG. 4B) through a dashed line 4B—4B shown in FIG. 4A of a portion 400 of a semiconductor body 401 having a top surface 402 (shown in FIG. 4B) which has been prepared using prior art techniques up to the point where the method of the present invention will be applied to fabricate a memory cell with increased distance between second output regions of access transistors of adjacent memory cells. In the semiconductor body 401 there are shown formed four essentially identical trenches 460-1, 460-2, 460-3, and 460-4 in which storage capacitors and access transistors will subsequently be formed. A layer 403 of silicon nitride with top surface 404, which has been used as an etch mask in the formation of the trenches 460-1, 2, 3, and 4, remains on the top surface 402 of semiconductor body 401. An oxide layer 461-1, for example, has been formed on a surface 465-1 (FIG. 4B) of the trench 460-1. In a lower portion of the trench (shown in FIG. 4B) the oxide layer 461-1 has been replaced with a layer 443-1 of thinner oxide to increase the capacitance of the storage capacitor which will be formed in the lower portion of the trench 460-1. The trench 460-1 has been filled with a conductive material 441-1, typically doped polysilicon.

Figure 5A:
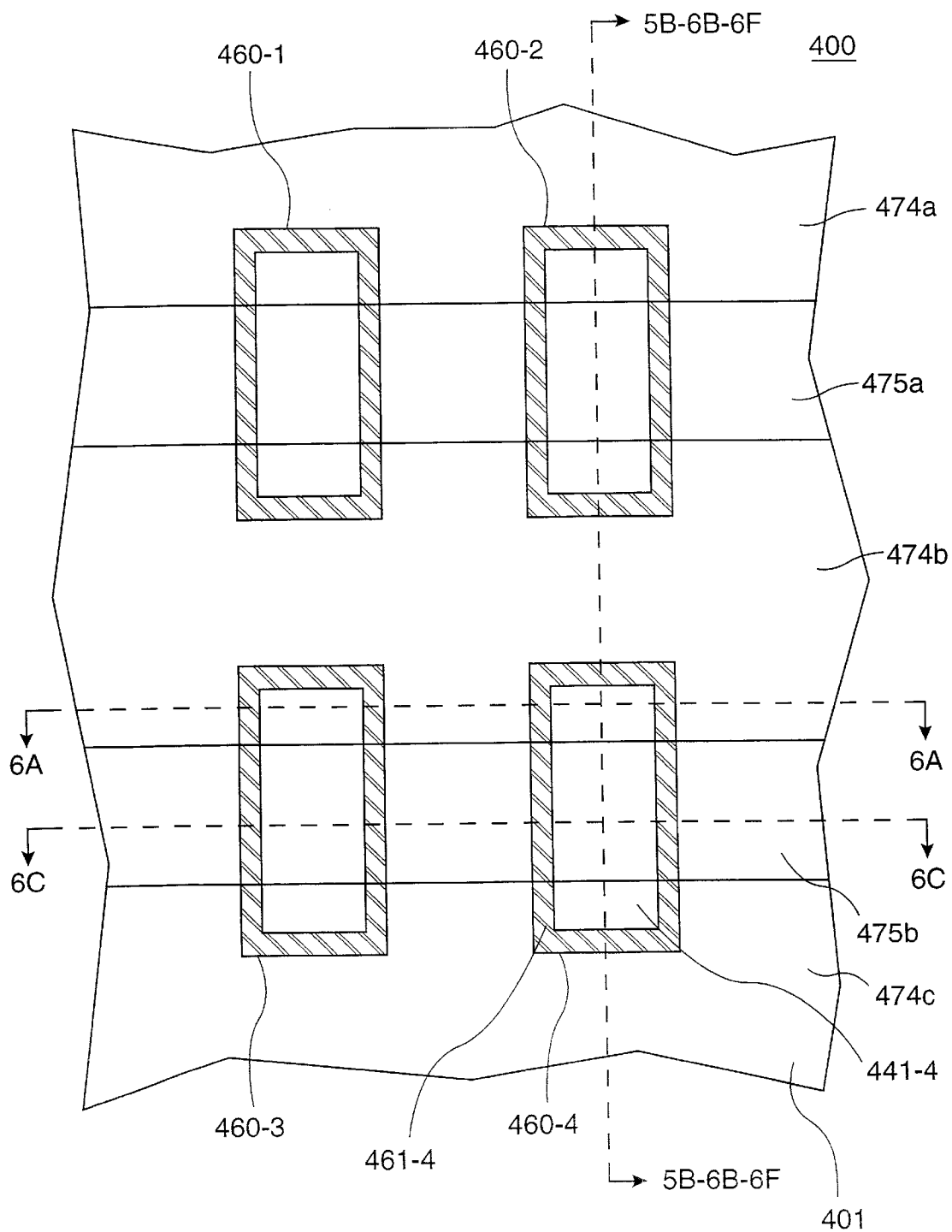
FIGS. 5A and 5B show a top view and a sectional view of the semiconductor body of FIGS. 4A and 4B after it has been further processed in accordance with the present invention.
Figure 5B:
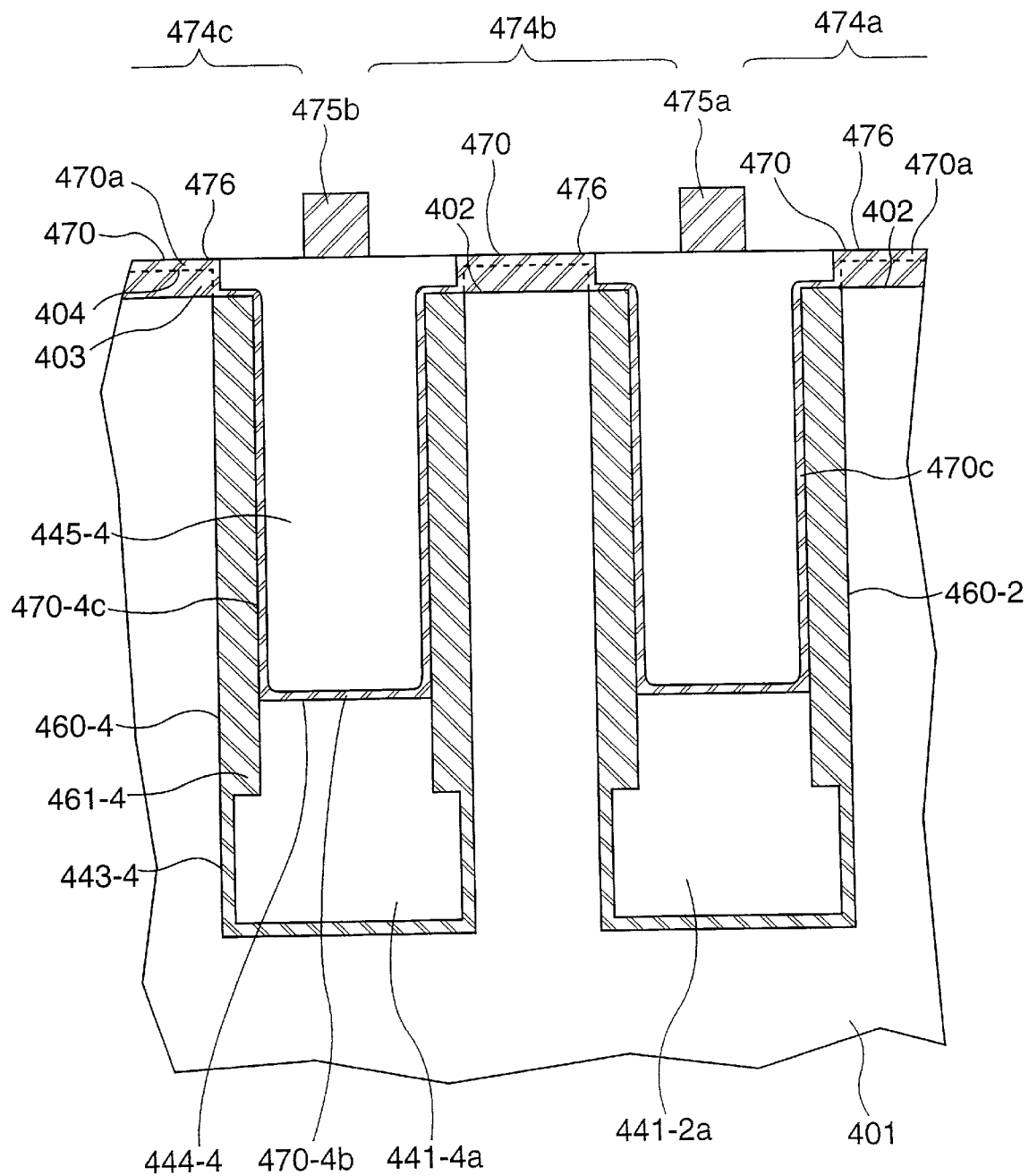

Referring now to FIGS. 5A and 5B, there is shown in FIG. 5A a top view of a portion 400 of the semiconductor body 401 shown in FIG. 4A after the semiconductor body 401 has been subjected to the first sequence of unique processing steps in accordance with the present invention. FIG. 5B shows a sectional view through a vertical dashed line 5B-6B-6F-5B-6B-6F of FIG. 5A. The reference plane is labeled 5B-6B-6F-5B-6B-6F since it will be used in subsequent figures. The semiconductor body 401 is first subjected to an anisotropic etch which removes a portion of the conductive material 441-4, for example, from the trench 460-4 down to a level which is above the boundary between the thick oxide layer 461-4 and the thin oxide layer 443-4 to leave a portion 441-4a of conductive material 441-4 having a top surface 444-4. The semiconductor body 401 is then subjected to an oxidizing ambient to form a thin layer of silicon oxide (not shown) on the exposed polysilicon surfaces 444-4. A layer 470 of silicon nitride is then formed on the semiconductor body 401. The layer 470 has a portion 470a with a top surface 476 which is formed on, and merges with, the surface 404 of the silicon nitride layer 403, and a portion 470-4b, for example, which is formed at the bottom of the trench 460-4 on a top surface 444-4 for example, of the conductor 441-4a. A thinner portion 470-4c, for example, is formed on an exposed portion of oxide layer 461-4 which forms the sidewalls of the trench 460-4. The trenches 460-1, 2, 3, and 4 are then filled with material, typically polysilicon, shown as layer 445-4 in trench 460-4. The portion of the polysilicon on a top surface 476 of the silicon nitride layer 470 is then removed, leaving the trench 460-4, for example, filled to the level of the top surface 476 of layer 470 with polysilicon layer 445-4. A hard mask layer is deposited and patterned using conventional lithographic techniques to result in portions 475a and 475b of the hard mask material, which portions partially define the regions where access transistors will subsequently be formed. The hard mask material is removed from areas 474a, 474b, and 474c. These are the areas where isolation trenches will subsequently be formed.

Figure 6A:
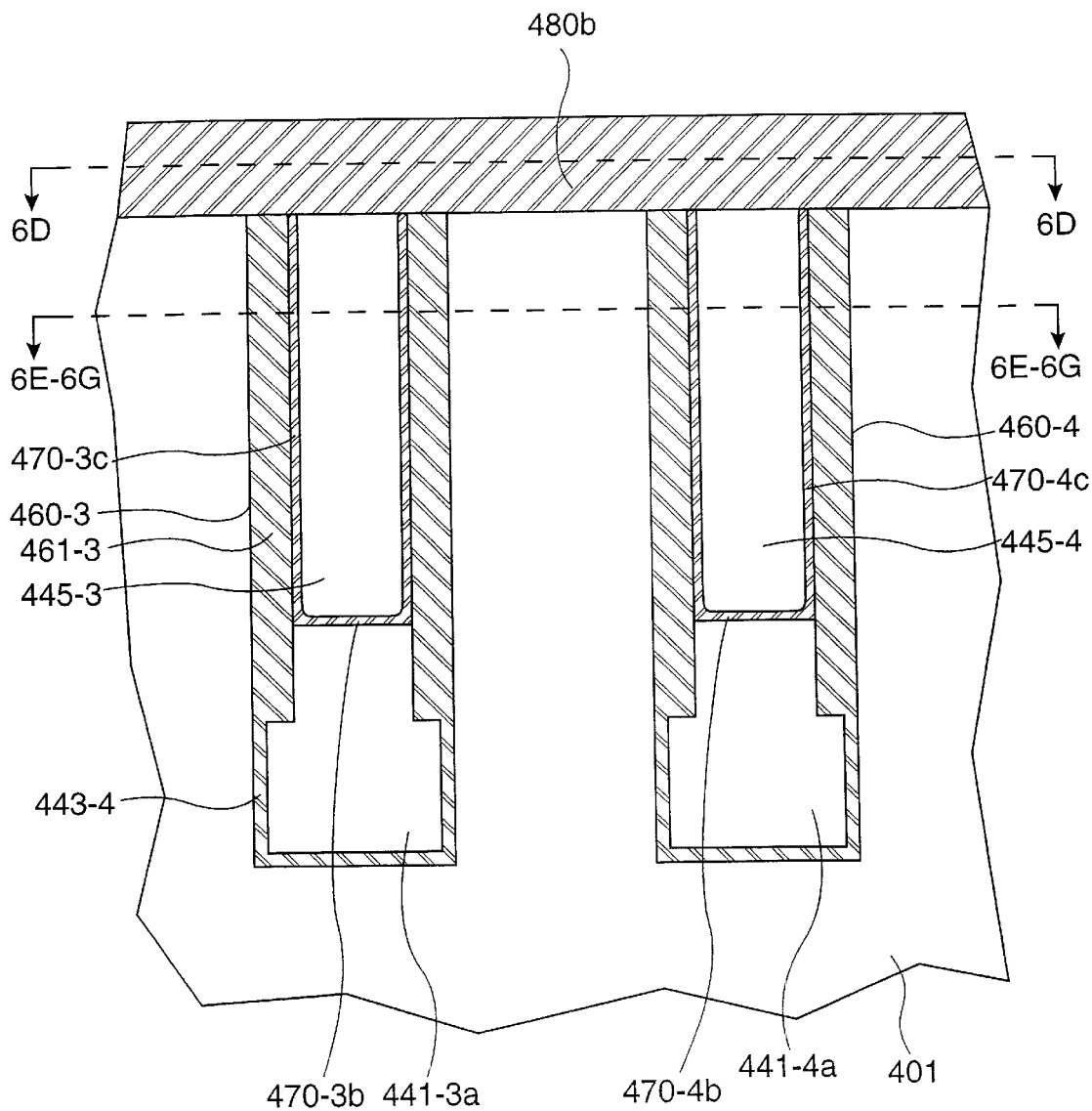
FIGS. 6A, 6B, 6C, 6D, 6E, 6F, and 6G show sectional views and sectional plan views of the semiconductor body of FIGS. 5A and 5B after it has been further processed in accordance with the present invention.
Figure 6B:
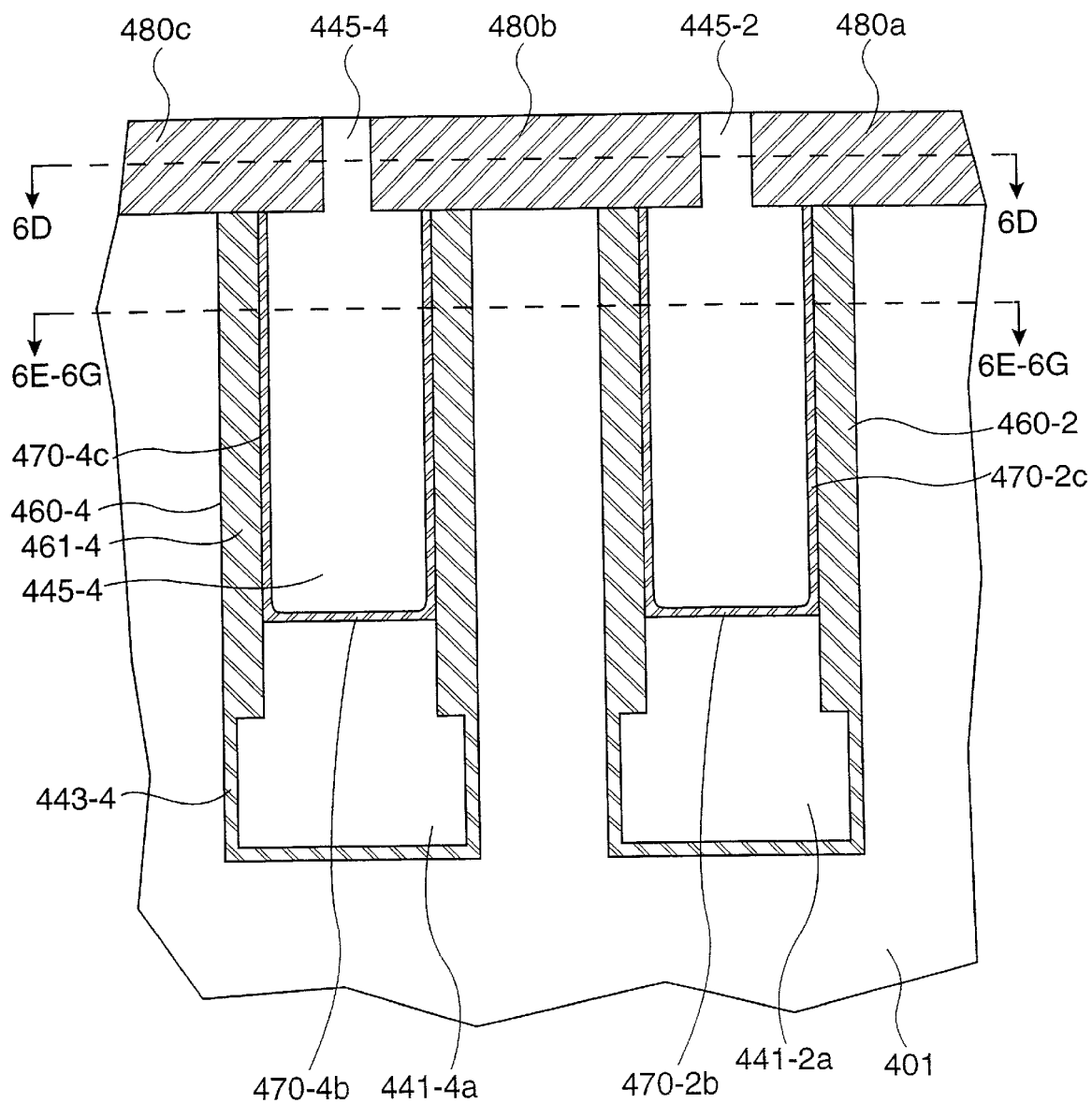
Figure 6C:
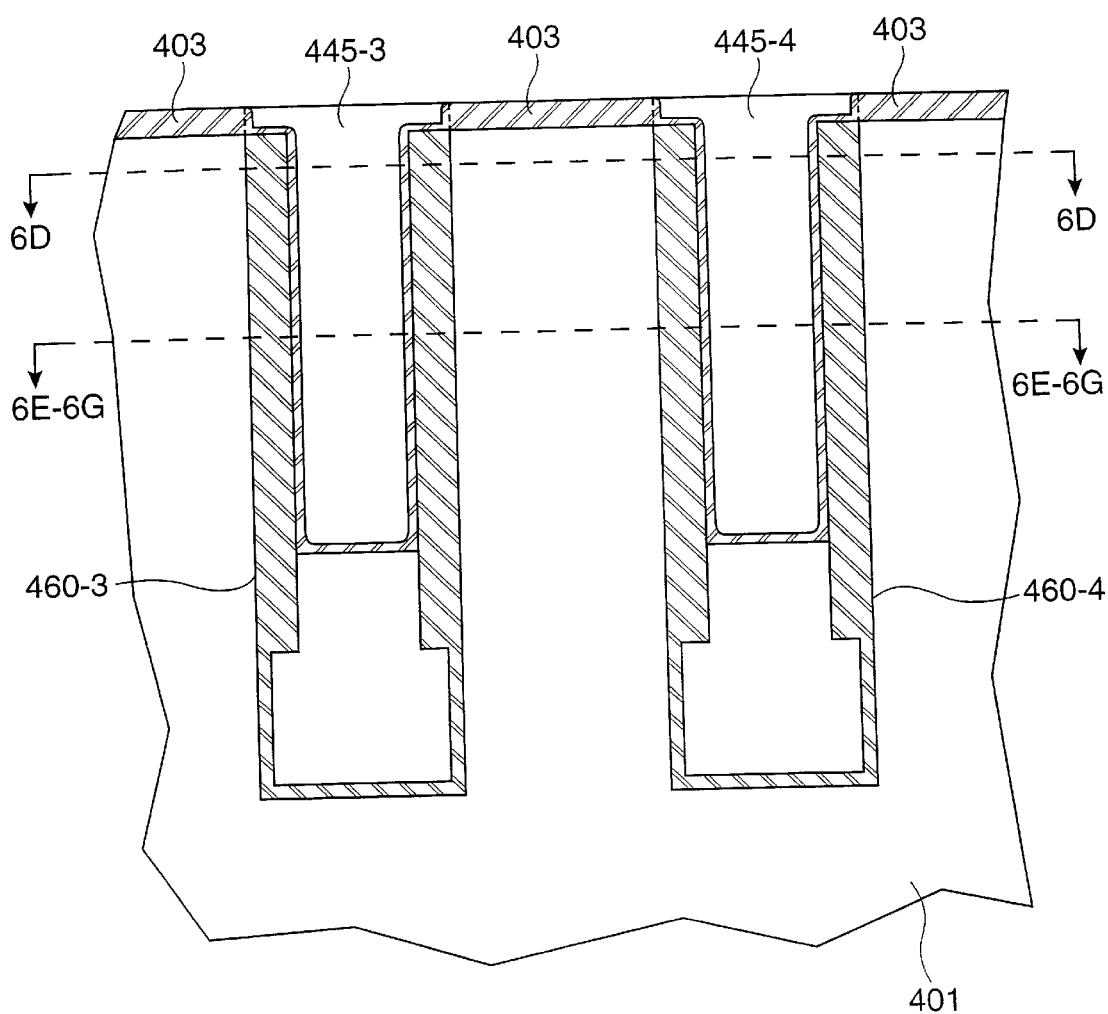

FIGS. 6A, 6B, and 6C are sectional views of the structure shown in FIGS. 5A and 5B, through the dashed lines 6A—6A, 5B-6B-6F-5B-6B-6F, and 6C—6C, respectively, of FIG. 5A, after additional processing steps have been performed. The structure of FIGS. 5A and 5B is first subjected to an anisotropic etch which removes, to prescribed depth, silicon, silicon oxide, and silicon nitride in the regions 474a, 474b, and 474c where the structure is not protected by the hard mask portions 475a and 475b to form isolation trenches (not shown). After the completion of the etching process and the removal of the hard mask portions 475a and 475b, the isolation trenches are filled with silicon oxide, and planarized to the top surface 476 of the silicon nitride layer 470 to form regions 480a (shown in FIG. 6B), 480b (shown in FIGS. 6A and 6B), and 480c (shown in FIG. 6B) of Shallow Trench Isolation (STI). The regions 480a-c are coincident with the regions 474a-c, respectively, of FIG. 5A.

Figure 6D:
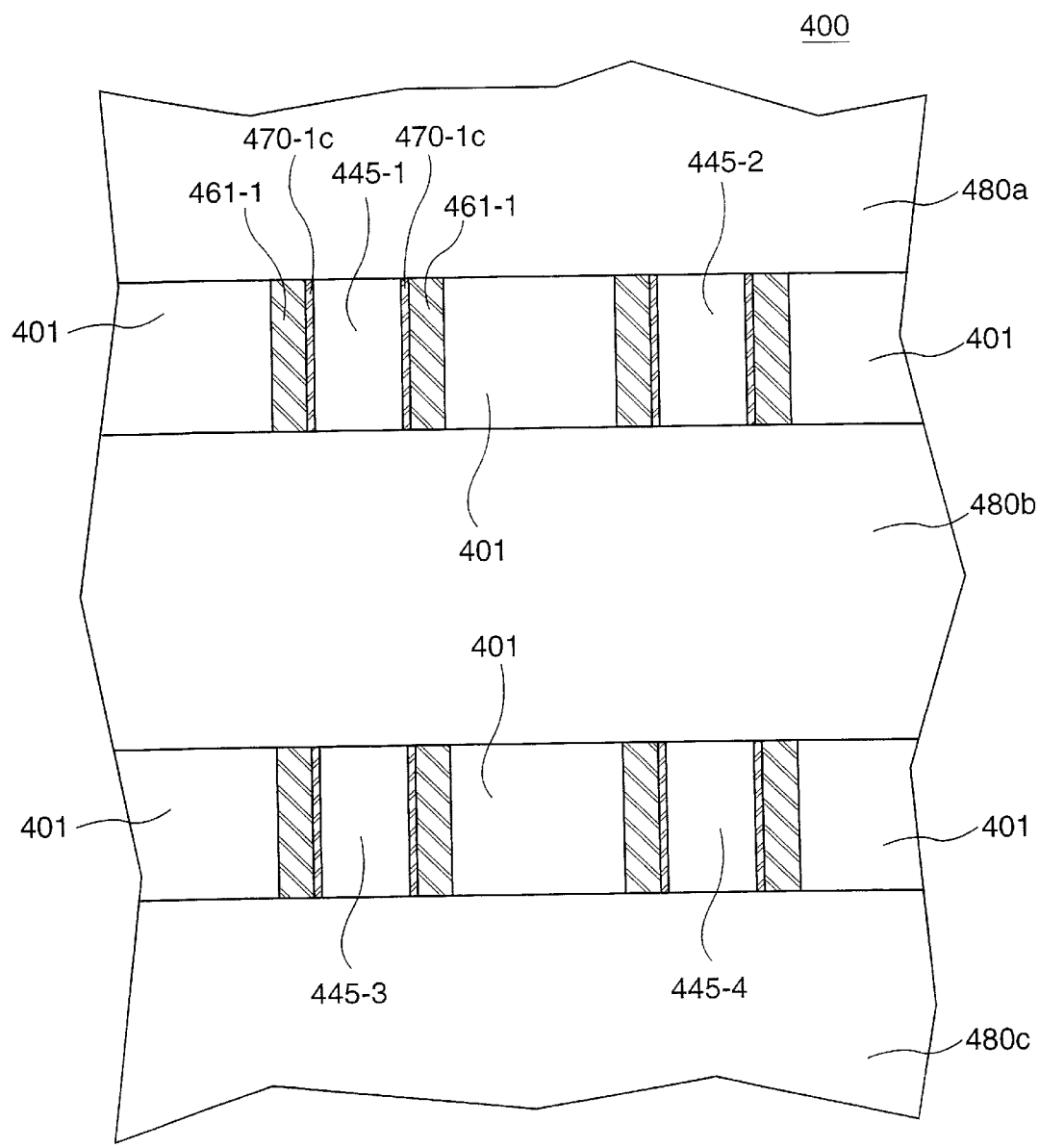
Figure 6E:
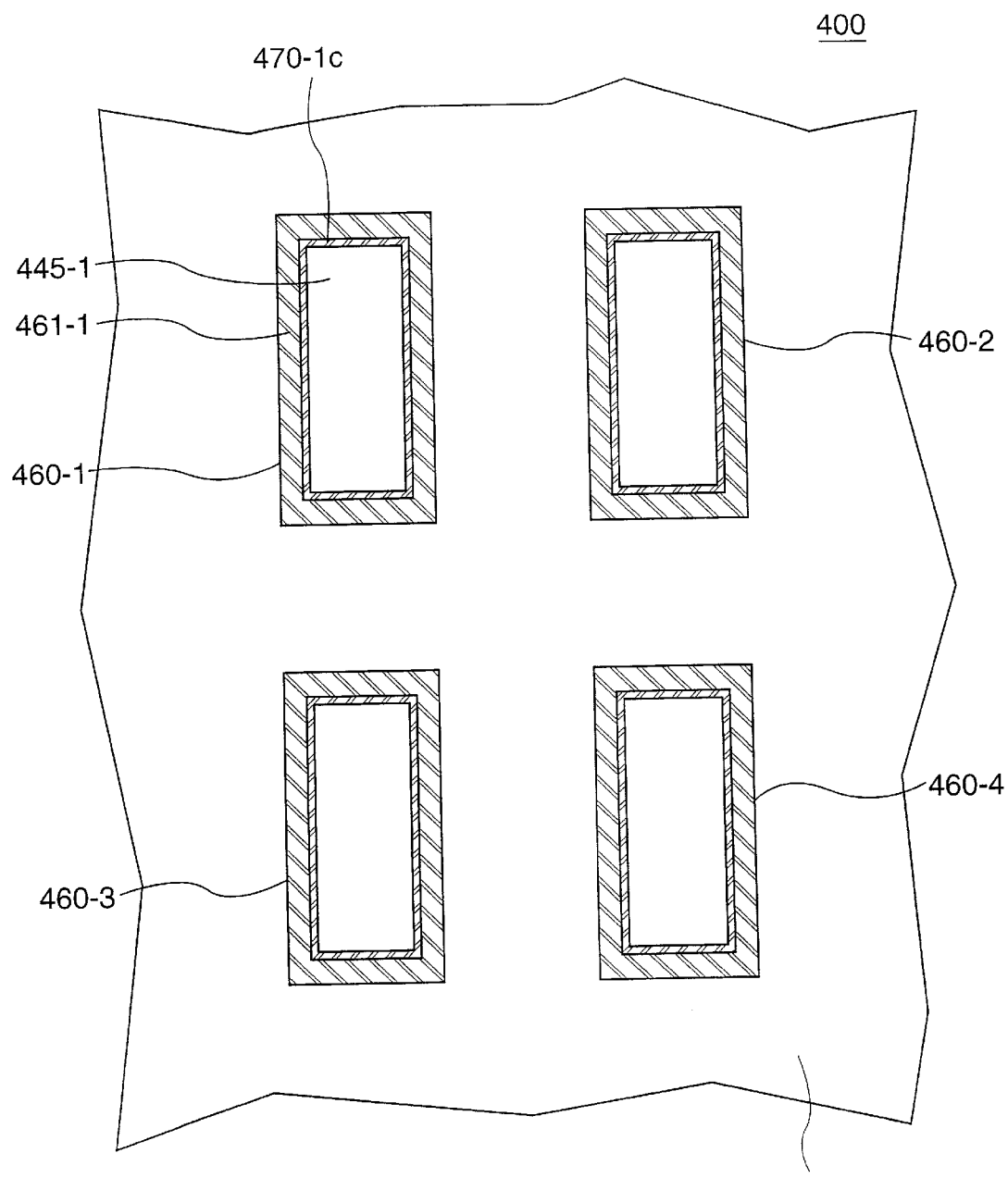

FIG. 6D is a sectional plan view through a dashed line 6D—6D in FIGS. 6A, 6B, and 6C, and is a view through the regions 480a, 480c, and 480c of the STI oxide. FIG. 6E is a sectional plan view through the dashed line 6E-6G-6E-6G in FIGS. 6A, 6B, and 6C, and is a view below the regions of the STI. It can be seen in FIG. 6E that at the plane 6E-6G-6E-6G, the trenches 460-1, 2, 3, and 4 have a rectangular shape, are lined with the oxide layers 461-1, 2, 3, and 4, respectively, and the silicon nitride layers 470-1c, 471-2c, 470-3c, 470-4c, and are filled with polysilicon 445-1, 2, 3, and 4. In contrast, FIG. 6D shows that at the plane defined by the dashed line 6D—6D in FIGS. 6A, 6B, and 6C, on the upper and lower sides of the trenches 460-1, 2, 3, and 4 portions of the layers 461-1, 2, 3, and 4, portions of the layers 470-1c, 2c, 3c, and 4c, and portions of the polysilicon 445-1, 2, 3, and 4 have been removed and replaced with portions of layers 480a, 480b, and 480c of the STI silicon oxide.

The next step in the process is to use an anisotropic etch to remove portions of the polysilicon 445-1, 2, 3, and 4 from the trenches 460-1, 2, 3, and 4, respectively, where they are not covered by the STI silicon oxide regions 480a, 480b, or 480c. The removed portions of polysilicon 445-1, 2, 3, and 4 is removed down to the portions 470-1b, 2b, 3b, and 4b of the silicon nitride layer 470.

Figure 6F:
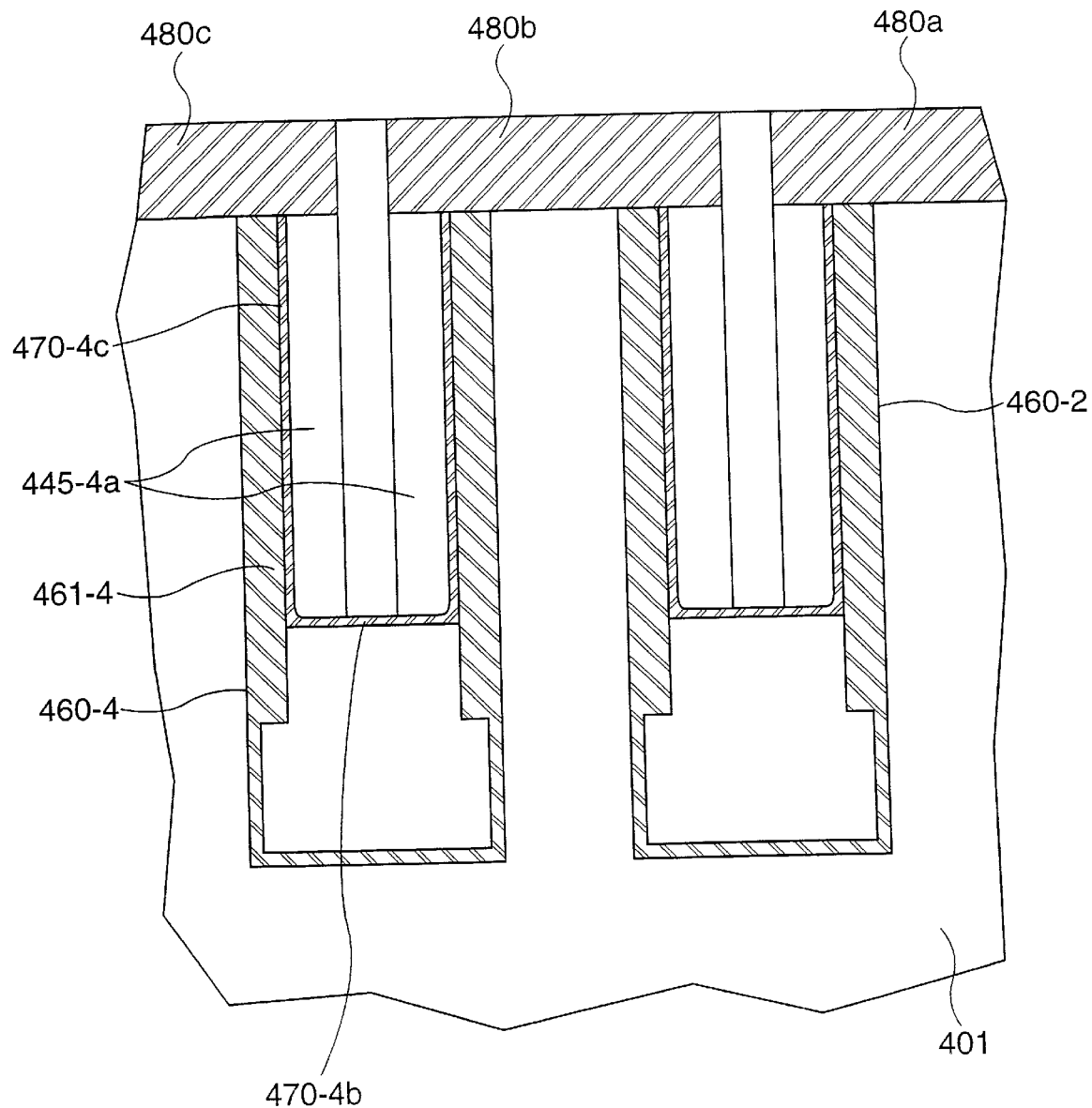
Figure 6G:
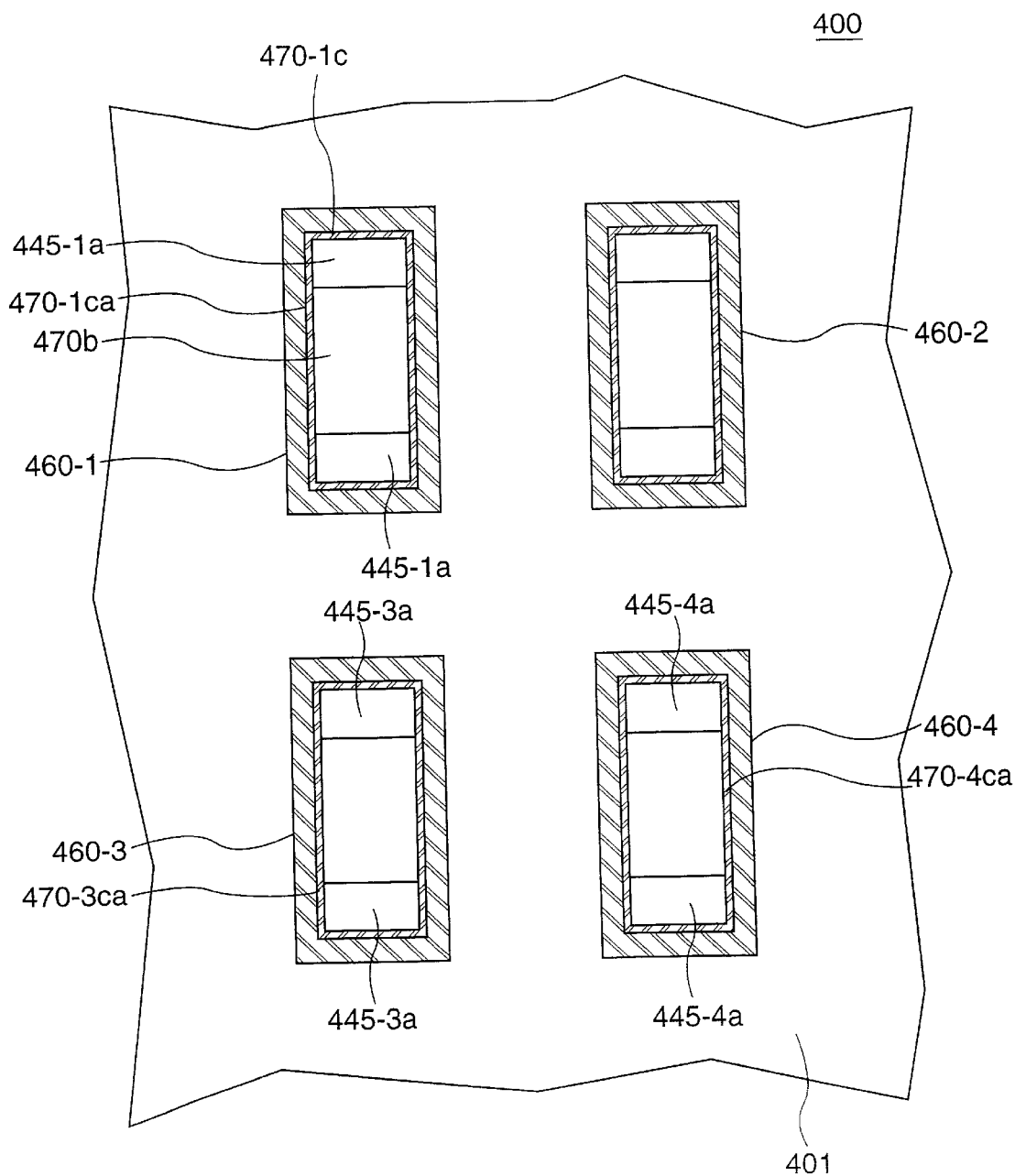

Referring now to FIGS. 6F and 6G, there is shown in FIG. 6F a sectional view, similar to FIG. 6B, through the vertical dashed line 5B-6B-6F-5B-6B-6F of FIG. 5A. FIG. 6G is a sectional plan view, similar to FIG. 6E, through the dashed line 6G—6G in FIGS. 6A–C, which is a view below the regions of the STI. It is seen in FIGS. 6F and 6G that the trenches 460-1, 2, 3, and 4 are now covered on two sides and portions of the other two sides with remaining portions 445-4a, for example, of polysilicon, and are covered on portions of the two remaining sides with remaining portions 470-4ca of the silicon nitride layer 470-4c, for example.

Figure 7A:
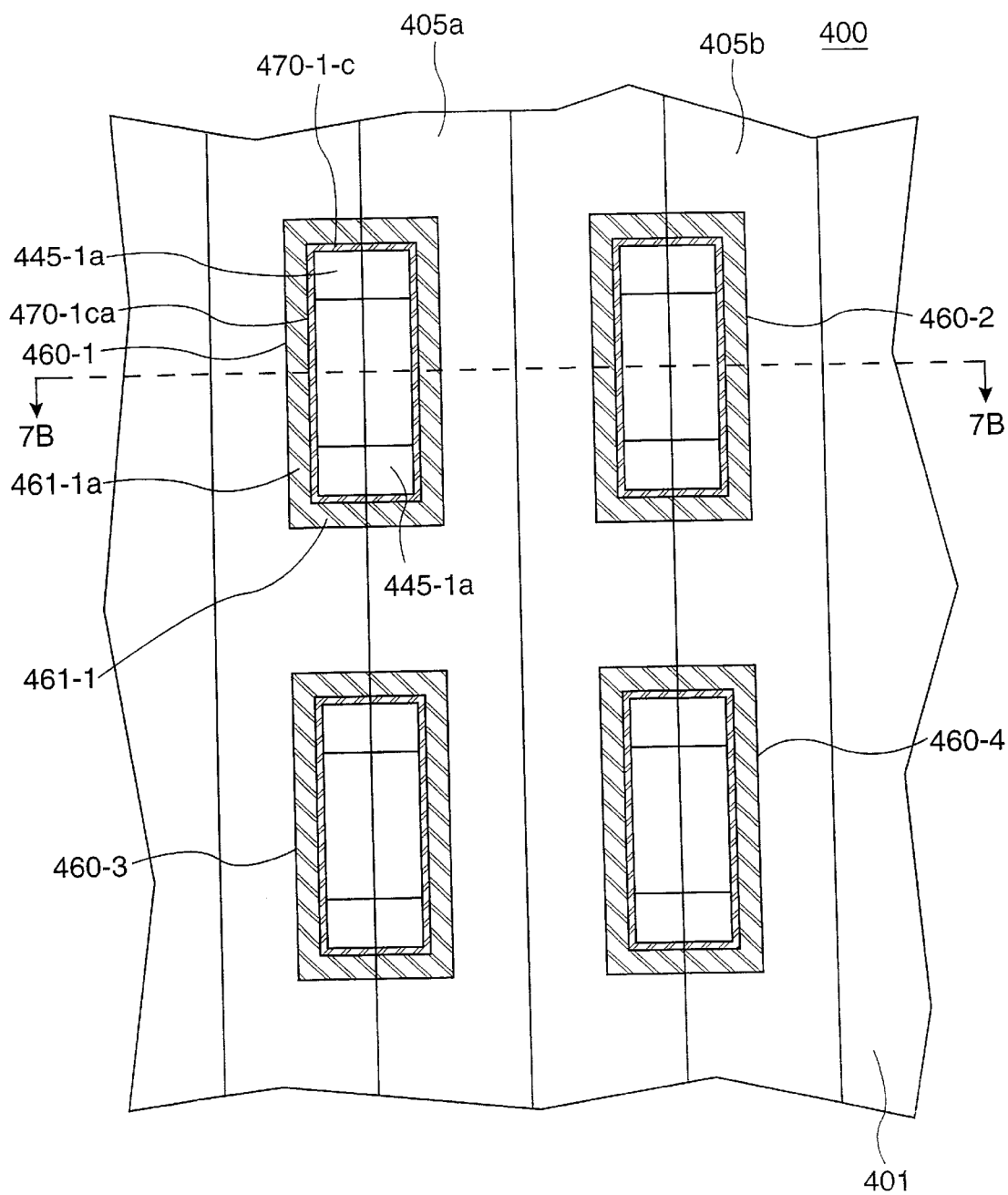
FIGS. 7A and 7B show a top view and a sectional view of the semiconductor body of FIGS. 6A, 6B, 6C, 6D, 6E, 6F, 6G after it has been further processed in accordance with the present invention.

FIG. 7A shows a top view of a portion 400 of the semiconductor body 401 after a layer of photoresist has been deposited and patterned leaving portions 405a and 405b. The portions 405a and 405b of photoresist on the semiconductor body 401 cover a right hand portion of the trenches 460-1, 2, 3, and 4, and fill the right portion of the trenches 460-1, 2, 3, and 4 where portions of the polysilicon 445-1, 2, 3, and 4 has been removed in the previous processing step.

Figure 7B:
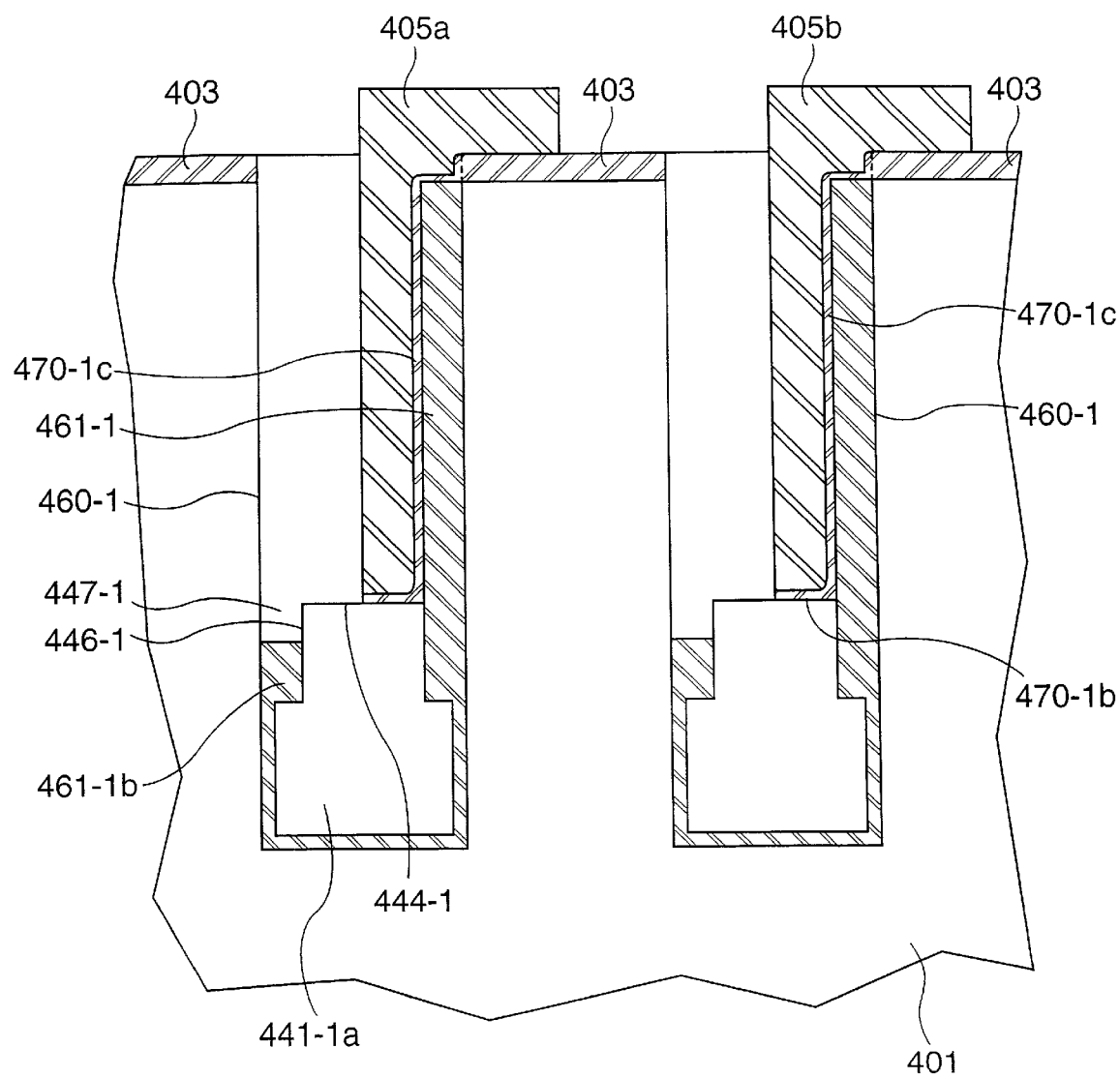

FIG. 7B shows a sectional view of the semiconductor body of FIG. 7A through a dashed line 7B—7B of FIG. 7A after the semiconductor body 401 has been subjected to two isotropic etch steps. The first isotropic etch removes those portions of the portion 470-1ca, for example, of silicon nitride layer 470-1c, which are not covered by the remaining portion 405a of photoresist. The second isotropic etch removes an exposed portion 461-1a, for example, of the oxide layer 461-1 which has been exposed by the removal of the portion 470-1ca of the silicon nitride layer 470-1c. Further, as is shown in FIG. 7B, a portion of the oxide layer 461-1, which is below the top surface 444-1 of the conductive material 441-1a, is removed. This leaves an exposed vertical side surface 446-1 of the conductive material 441-1a and a void 447-1. The void region 447-1, for example, will subsequently be filled with a conductive material, typically doped polysilicon, which will connect, or strap, a first plate 441-1a, for example, of a storage capacitor 440-1 (not shown) to a second output region 433-1 (shown in FIG. 9), for example, of an access transistor 430-1 (shown in FIG. 9).

Figure 8:
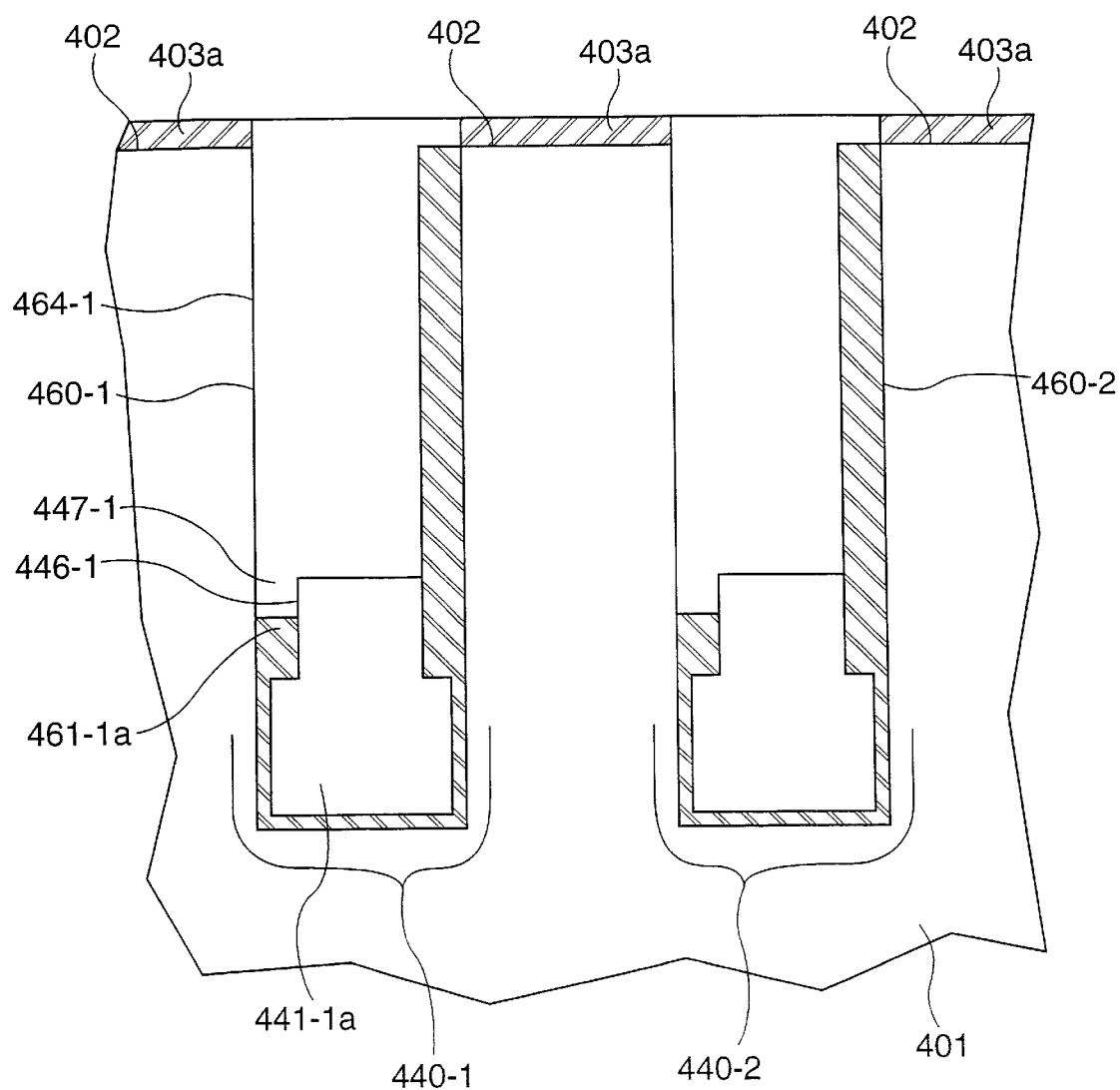
FIG. 8 shows a sectional view of the semiconductor body of FIGS. 7A and 7B after it has been further processed in accordance with the present invention.

FIG. 8 shows the semiconductor body as pictured in FIG. 7B after the next step in the process, which is to remove the remaining photoresist layers 405a and 405b, and to expose the semiconductor body 401 to an isotropic etch which removes the remaining portions of the silicon nitride layers 470-1b and 470-1c, for example, leaving a portion 403a of the silicon nitride layer 403 on the top surface 402 of the semiconductor body 401.

At this point in the process sequence the memory cell structure depicted in FIG. 8 is ready to complete processing using conventional processing for memory cells in which a vertical trench is used to form the storage capacitor and the access transistor is a vertical channel transistor formed on the sidewall of the vertical trench.

Figure 9:
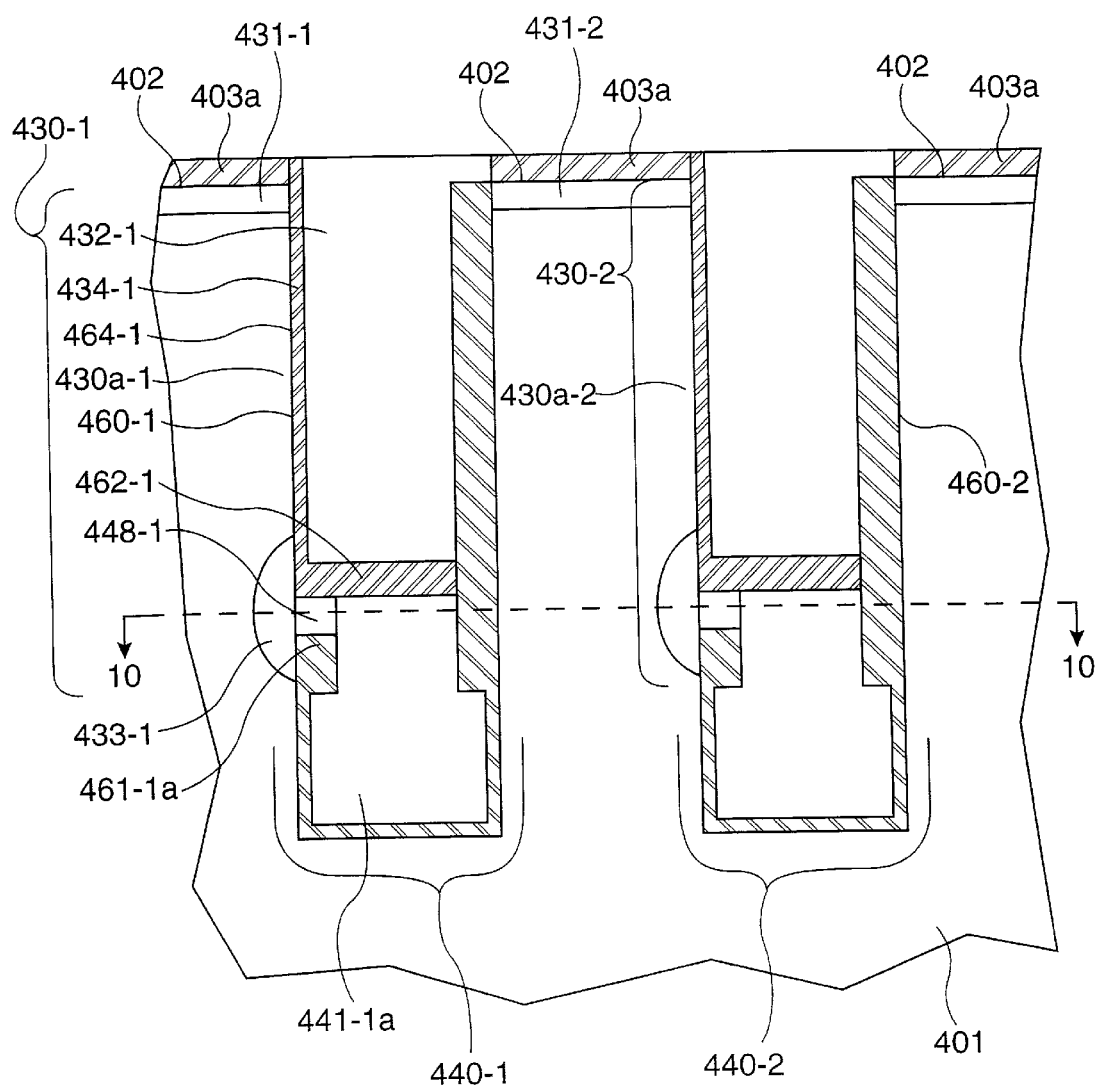
FIGS. 9 and 10 show a sectional view and a sectional plan view, respectively, of the semiconductor body of FIG. 8 after it has been further processed in accordance with the present invention.

FIG. 9 shows the memory cell structure depicted in FIG. 8 after the completion of a portion of such conventional processing. Typical conventional processing includes the steps of: filling the trenches 460-1, 2, 3, and 4 with a doped polysilicon layer on the sidewalls and bottom surface of the trenches, including filling the voids 447-1, 2, 3, and 4 (see FIG. 8); etching the previously formed doped polysilicon layer to remove it from all surfaces except that portion of the polysilicon film which fills the voids 447-1, 2, 3, and 4 to form straps 448-1, 2, 3, and 4 which will connect the first capacitor plates 441-1a, 2a, 3a, and 4a to the not yet formed second output regions 433-1, 2, 3 and 4 of transistors 430-1, 2, 3, and 4 (not shown); oxidizing the exposed silicon surfaces to form layers 434-1, 2, 3, and 4 of gate dielectric on the exposed sidewalls 464-1, 2, 3, and 4 and layers 462-1, 2, 3, and 4 of insulating oxide on the top surface of the conductive regions 441-1a, 2a, 3a, and 4a and the strap regions 448-1, 2, 3, and 4; and filling the trenches with a conductive material 432-1, 2, 3, and 4, typically polysilicon, to form gate electrodes adjacent to the previously formed gate dielectric layers 434-1, 2, 3, and 4. During the thermal steps carried out in the process sequence, dopant material out-diffuses from the polysilicon straps 448-1, 2, 3, and 4 and from the first capacitor plates 441-1a, 2a, 3a, and 4a into the adjacent regions of the semiconductor body 401 to form second output regions 433-1, 2, 3, and 4. The thus formed output regions 433-1, 2, 3, and 4 are conductively connected to the conductive material 441-1a, 2a, 3a, and 4a which forms a plate of the storage capacitors 440-1, 2, 3, and 4. The other plate of the capacitor is the semiconductor body 401.

Further conventional processing includes the step of ion implanting dopant ions to form first output regions 431-1, 2, 3, and 4. The dopant ions which form the first output regions 431-1, 2, 3, and 4 are implanted into the top surface 402 of the semiconductor body 401. The energy of the ions is chosen to be sufficient such that the ions penetrate through the silicon nitride regions 403a into the semiconductor body 401 forming a first output region at the surface 402 underneath the silicon nitride region 403a, but is insufficient for the ions to penetrate through the regions 480a, 480b, and 480c (FIGS. 6A and 6B) of the STI oxide. Since this same STI oxide has previously been used to define the regions (as shown in FIGS. 6F and 6G) where the channel regions 430a-1, 2, 3, of the transistors 430-1, 2, 3, and 4 and strap regions 448-1, 2, 3, and 4 were formed, the resulting first output regions are self-aligned to the channel regions and second output regions of the transistor. A portion of the implanted ions will enter the gate regions 432-1, 2, 3, and 4 of the transistors but have little effect on the net doping of the gate material.

Figure 3:
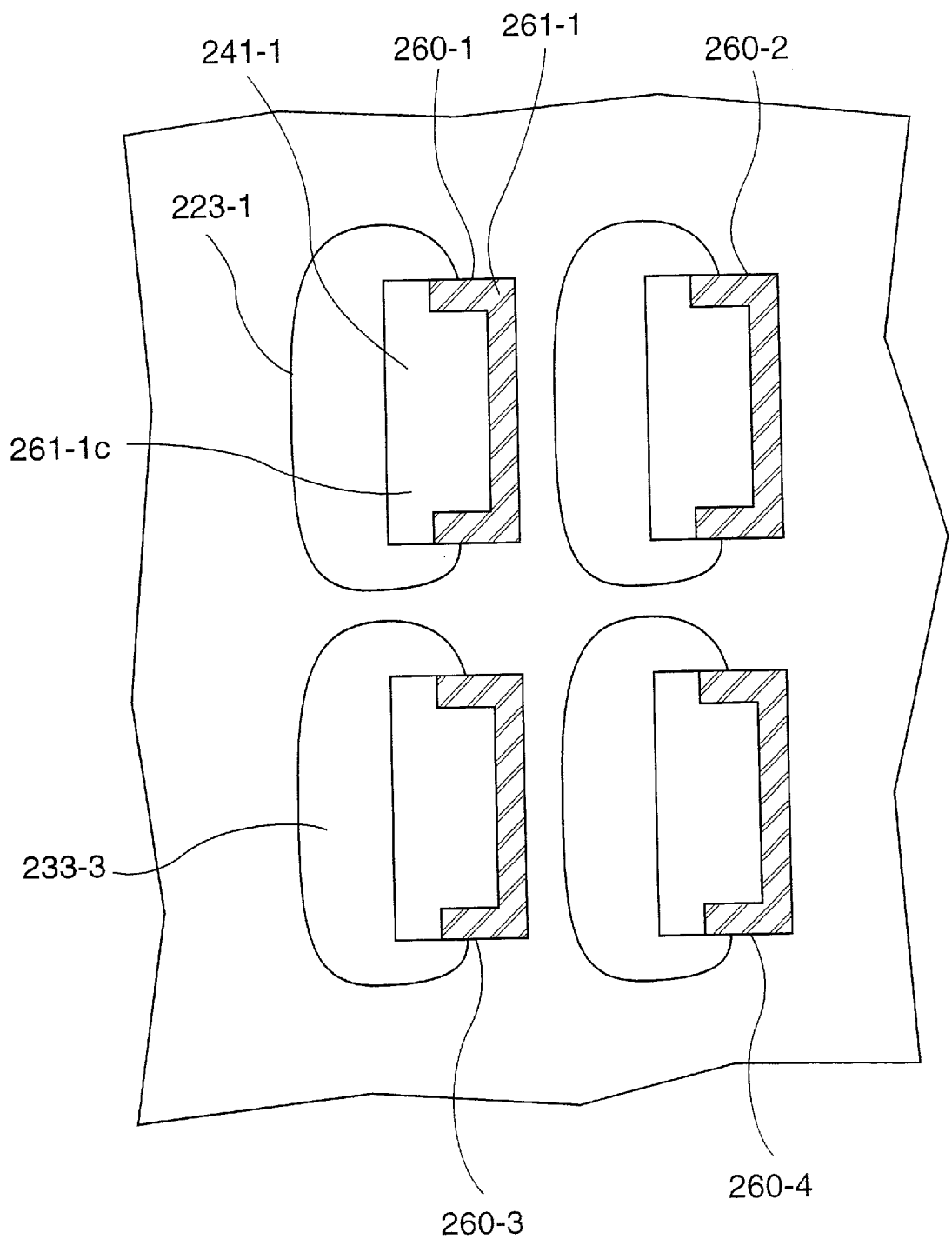
FIG. 3 shows a sectional plan view of portions of four prior art memory cells.
Figure 10:
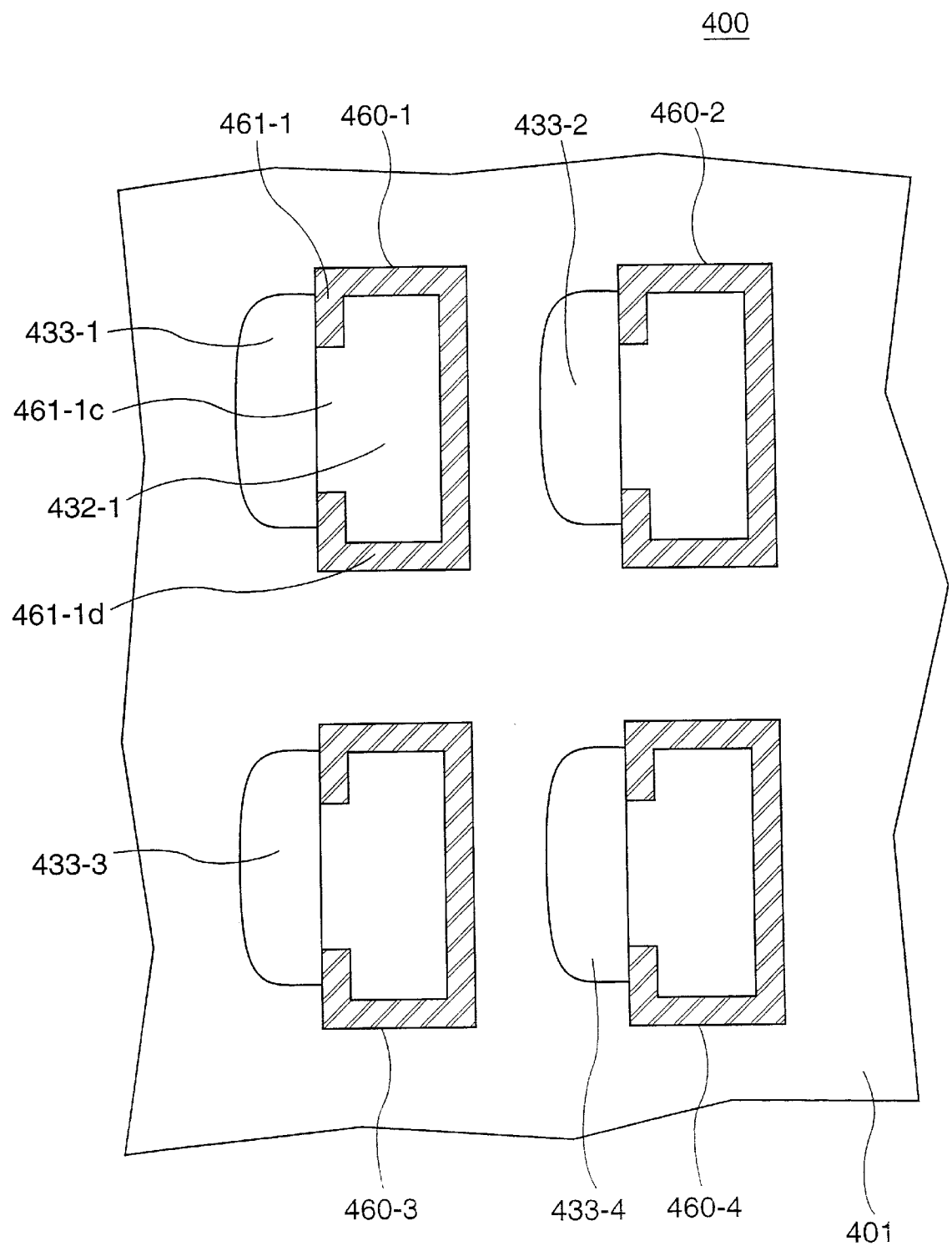

FIG. 10 is sectional plan view of a memory cell fabricated in accordance with the present inventive process, viewed through a dashed line 10—10 in FIG. 9. FIG. 3 is a similar sectional top view of a memory cell produced by a prior art process, viewed at the equivalent position as FIG. 10. The memory cell produced by the inventive process described herein and pictured in FIG. 10 differs from memory cells produced using the prior art process method in the following significant manner. The opening 461-1c, 2c, 3c, and 4c in the oxide layer 461-1, 2, 3, and 4 is confined to a central portion of one wall of the trenches 460-1, 2, 3, and 4. The remaining portion 461-1d, 2d, 3d, and 4d of the oxide layer 461-1, 2, 3, and 4 covers three of the walls of the trench and the two end portions of the fourth wall. The out-diffused output regions 433-1, 2, 3, and 4 are confined to one side of the trenches 460-1, 2, 3, and 4.

In the prior art memory cell pictured in FIG. 3 the openings 261-1c, 2c, 3c, and 4c extend along one full wall and along portions of two adjacent walls of the trenches 260-1, 2, 3, and 4. This allows the out-diffused output region 233-1, 2, 3, and 4 to be along three sides of the trenches 260-1, 2, 3, and 4. If the sizes and spacing of the trenches 260-1, 2, 3, and 4 of FIG. 3 and trenches 460-1, 2, 3, and 4 of FIG. 10 are equal, the output regions of adjacent memory cells in the prior art structure of FIG. 3, for example output regions 233-1 and 233-3, can be closer to one another than the equivalent output regions 433-1 and 433-3 in the inventive structure depicted in FIG. 10.

It is to be understood that the specific embodiments described herein are illustrative of the general principles of the invention and that various modifications may be made in the process methods and in the lithographic mask features used to produce the apparatus without departing from the spirit and scope of the present invention. While the specific embodiment described herein is in reference to a memory cell trench which has a rectangular cross-section with a 2:1 aspect ratio between the sides of the rectangle, it is to be understood that the present invention is equally applicable to a memory cell trench with different a cross-section. For example, the cross-section of the trench may be a rectangle with a different aspect ratio between the sides, or a trench whose cross-section is a square, a circle, or an ellipse, or whose cross-section is a combination of various curved lines, straight lines, or a mixture of curved and straight lines. While the specific embodiment described herein is in reference to a memory cell wherein a second output region of an access transistor is confined to a portion of one side of a rectangular cross-section of a memory cell trench, it is to be understood that the method of the present invention is equally applicable when it is desired to confine the second output region of the access transistor to a small portion of a perimeter of the cross-section of the memory cell trench when the said perimeter is of a curved nature without discrete sides.

What is claimed is:

1. An array of memory cells with each memory cell formed in and on a semiconductor body having a top surface, each of the memory cells including a vertical field effect transistor having a gate and first and second output regions separated by a channel region and a capacitor formed within a trench in the semiconductor body with a first plate of the capacitor being partially surrounded by an insulating layer and being coupled to the second output region through a strap region with the insulating layer surrounding the first plate on all sides except for a selected portion of just one side of the first plate such that the second output region, which is formed by out-diffusion of impurities from the strap region and the first plate, is limited in lateral extent so as to limit electrical leakage between second output regions of adjacent memory cells.

2. The array of memory cells of claim 1 wherein a cross-section of each trench is a rectangle with a 2:1 aspect ratio.

3. The array of memory cells of claim 1 wherein the cross-section of each trench is one of a group of geometric shapes consisting of rectangles, squares, ellipses, circles, combinations of various curved line segments, combinations of various straight line segments, and combinations of various straight and curved line segments.

4. The array of memory cells of claim 1 wherein each strap region is confined to a small portion of the periphery of a cross-section of said trench such that the second output region is limited in lateral extent so as to limit electrical leakage between second output regions of adjacent memory cells.

5. An array of memory cells with each memory cell formed in and on a semiconductor body having a top surface, with the memory cell including a vertical field effect transistor having a gate and first and second output regions separated by a channel region and a capacitor formed within a trench in the semiconductor body with a first doped polysilicon plate of the capacitor being partially surrounded by an insulating layer and being coupled to the second output region through a doped polysilicon strap region with the insulating layer surrounding the first plate on all sides except for a selected portion of just one side of the first plate such that the second output region, which is formed by out-diffusion of impurities from the strap region and the first plate, is limited in lateral extent so as to limit electrical leakage between second output regions of adjacent memory cells and the first output region being self aligned to the channel region and to the second output region.

* * * * *